United States Patent
Hirata et al.

(10) Patent No.: US 10,174,858 B2
(45) Date of Patent: Jan. 8, 2019

(54) PIEZOELECTRIC ELEMENT-DRIVEN VALVE AND FLOW RATE CONTROL DEVICE INCLUDING PIEZOELECTRIC ELEMENT-DRIVEN VALVE

(71) Applicant: FUJIKIN INCORPORATED, Osaka (JP)

(72) Inventors: Kaoru Hirata, Osaka (JP); Katsuyuki Sugita, Osaka (JP); Ryousuke Dohi, Osaka (JP); Kouji Nishino, Osaka (JP); Nobukazu Ikeda, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 0 days.

(21) Appl. No.: 15/506,162

(22) PCT Filed: Aug. 17, 2015

(86) PCT No.: PCT/JP2015/004062
§ 371 (c)(1),
(2) Date: Feb. 23, 2017

(87) PCT Pub. No.: WO2016/035262
PCT Pub. Date: Mar. 10, 2016

(65) Prior Publication Data
US 2017/0254430 A1 Sep. 7, 2017

(30) Foreign Application Priority Data

Sep. 1, 2014 (JP) .................. 2014-177202

(51) Int. Cl.
*F16K 31/00* (2006.01)
*F16K 7/14* (2006.01)
(Continued)

(52) U.S. Cl.
CPC ............. *F16K 31/004* (2013.01); *F16K 7/14* (2013.01); *F16K 7/16* (2013.01); *F16K 31/007* (2013.01);
(Continued)

(58) Field of Classification Search
CPC .... F16K 31/007; F16K 31/008; F16K 27/041; F16K 27/048; H01L 41/053; H01L 41/25; H01L 41/23; H01L 41/29; Y10T 137/7761
(Continued)

(56) References Cited

U.S. PATENT DOCUMENTS 5,169,067 A * 12/1992 Matsusaka ........... F02M 51/005
                                                                239/102.2
6,202,670 B1 * 3/2001 O'Neill ................. F16K 31/007
                                                                137/625.5
(Continued)

FOREIGN PATENT DOCUMENTS

JP 1-203779 A 8/1989
JP 2003-120832 A 4/2003
(Continued)

OTHER PUBLICATIONS

International Search Report issued in corresponding application PCT/JP2015/004062, completed Nov. 2, 2015 and dated Nov. 17, 2015.

*Primary Examiner* — Matthew W Jellett
(74) *Attorney, Agent, or Firm* — Griffin and Szipl PC (57) ABSTRACT

A piezoelectric element-driven valve includes a body provided with a fluid channel and a valve seat, a valve element which opens and closes the fluid channel by being in contact with and separated from the valve seat of the body, and piezoelectric actuators which drive the valve element to open and close by means of the extension of the piezoelectric element. In the piezoelectric element-driven valve, at least two piezoelectric actuators are arranged on a straight line via a spacer which allows pulling out of wiring.

17 Claims, 6 Drawing Sheets

(51) Int. Cl.
*H01L 41/053* (2006.01)
*H01L 41/083* (2006.01)
*H01L 41/09* (2006.01)
*G05D 7/06* (2006.01)
*F16K 7/16* (2006.01)

(52) U.S. Cl.
CPC ......... *G05D 7/0635* (2013.01); *H01L 41/053* (2013.01); *H01L 41/083* (2013.01); *H01L 41/09* (2013.01)

(58) Field of Classification Search
USPC ............. 310/328, 348, 349, 354; 251/129.06
See application file for complete search history.

(56) References Cited

U.S. PATENT DOCUMENTS

| | | | |
|---|---|---|---|
| 6,206,341 B1 * | 3/2001 | O'Neill | F16K 31/007 251/129.06 |
| 6,345,771 B1 * | 2/2002 | Gromek | F02M 51/0603 239/102.2 |
| 8,390,177 B2 * | 3/2013 | Turner | G01F 23/2966 310/324 |
| 2003/0168937 A1 | 9/2003 | Heinz et al. | |
| 2010/0127196 A1 | 5/2010 | Sawada et al. | |
| 2010/0294964 A1 | 11/2010 | Matsumoto et al. | |
| 2011/0042595 A1 | 2/2011 | Matsumoto et al. | |
| 2012/0273061 A1 | 11/2012 | Hidaka et al. | |

FOREIGN PATENT DOCUMENTS

| | | |
|---|---|---|
| JP | 2003-534512 A | 11/2003 |
| JP | 2004-197754 A | 7/2004 |
| JP | 2005-149075 A | 6/2005 |
| JP | 2007-192269 A | 8/2007 |
| JP | 2008-249002 A | 10/2008 |
| JP | 2009-204045 A | 9/2009 |
| JP | 2011-117499 A | 6/2011 |
| WO | 2007/083439 A1 | 7/2007 |
| WO | 2008/129783 A1 | 10/2008 |
| WO | 2011/067891 A1 | 6/2011 |

* cited by examiner

PIEZOELECTRIC ELEMENT-DRIVEN VALVE AND FLOW RATE CONTROL DEVICE INCLUDING PIEZOELECTRIC ELEMENT-DRIVEN VALVE

This is a National Phase Application in the United States of International Patent Application No. PCT/JP2015/004062 filed Aug. 17, 2015, which claims priority on Japanese Patent Application No. 2014-177202, filed Sep. 1, 2014. The entire disclosures of the above patent applications are hereby incorporated by reference.

TECHNICAL FIELD

The present invention relates to an improvement in a piezoelectric element-driven valve which controls the flow rate of the fluid provided in a fluid supply line for semiconductor manufacturing facilities, chemical industry facilities, pharmaceutical industry facilities, food industry facilities and the like and an improvement in a flow-rate control device including piezoelectric element-driven valve, and in particular, to a piezoelectric element-driven valve and a flow-rate control device including piezoelectric element-driven valve which allow increased amount of displacement of a piezoelectric element, and also do not disturb wiring, etc.

BACKGROUND ART

Heretofore, in fluid supply lines such as semiconductor manufacturing facilities and chemical industry facilities, piezoelectric element-driven valves and flow-rate control devices including piezoelectric element-driven valves have been widely used (for example, refer to patent document 1, patent document 2, patent document 3, patent document 4, patent document 5, patent document 6 and patent document 7).

Figure 9:
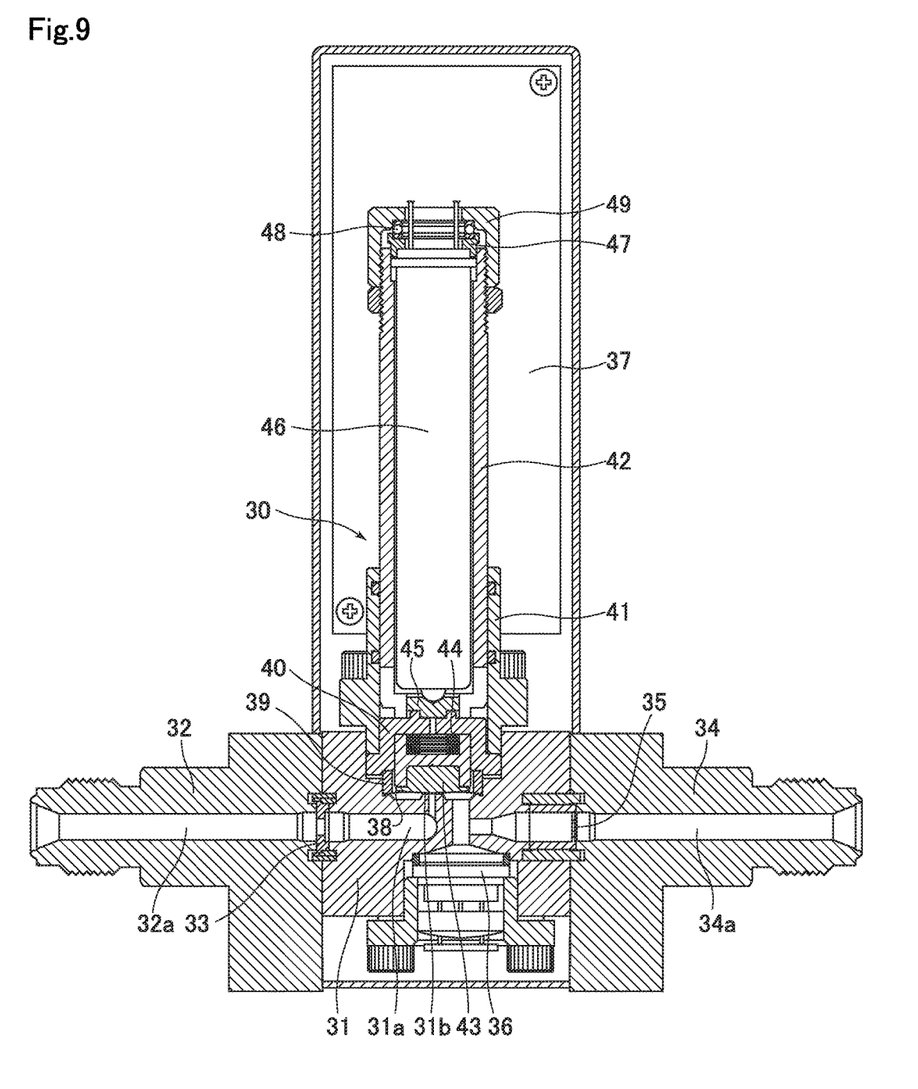
FIG. 9 is a cross-sectional view of a known flow-rate control device including a piezoelectric element-driven valve.

FIG. 9 shows an example of a conventional piezoelectric element-driven valve 30 and a flow-rate control device including the piezoelectric element-driven valve 30.

That is, the flow-rate control device is composed of a piezoelectric element-driven valve 30, an inlet side block 32 fastened and fixed with a bolt (not illustrated) on the upstream side of a body 31 of the piezoelectric element-driven valve 30, and having formed therein an inlet side fluid channel 32a which is in communication with a fluid channel 31a of the body 31, a sealing gasket 33 interposed between the body 31 and the inlet side block 32, an outlet side block 34 fastened and fixed with a bolt (not illustrated) on the downstream side of the body 31 of the piezoelectric element-driven valve 30, and having formed therein an outlet side fluid channel 34a which is in communication with the fluid channel 31a of the body 31, a gasket type orifice 35 for controlling flow rate interposed between the body 31 and the outlet side block 34, a pressure sensor 36 arranged on the body 31 of the piezoelectric element-driven valve 30 and detecting the pressure on the upstream side of the gasket type orifice 35, a control unit 37 which controls the piezoelectric element-driven valve 30, and other components, and is so configured that the piezoelectric element-driven valve 30 is opened and closed to control the flow rate passing through the orifice while calculating the flow rate passing through the orifice by the pressure on the upstream side of the gasket type orifice 35.

Moreover, the piezoelectric element-driven valve 30 is formed as a normal close-type piezoelectric driven valve including the body 31 provided with the fluid channel 31a and a valve seat 31b, a valve element 38 (metal diaphragm) to be in contact with, and separated from, the valve seat 31b, a presser adapter 39 which presses the outer peripheral edge portion of the valve element 38 in an airtight manner toward the body 31 side, a split base 40 having a half-split structure which presses the presser adapter 39 toward the body 31, a base pressor 41 which fixes the presser adapter 39 and the split base 40 toward the body 31 side, an actuator box 42 supported ascendably and descendably by the base pressor 41, a diaphragm presser 43 which is inserted at the lower end of the actuator box 42 and is in contact with the valve element 38, an elastic body 44 which is interposed between the split base 40 and the actuator box 42 and downwardly presses and biases the actuator box 42, a piezoelectric actuator 46 which is accommodated in the actuator box 42 and which has a lower end side supported by the split base 40 via a lower receiver 45, an adjustment cap nut 49 which is threadably mounted on the upper end portion of the actuator box 42 and which positionably supports the upper end side of the piezoelectric actuator 46 via an upper receiver 47 and a thrust bearing 48, wherein extension of the piezoelectric actuator 46 due to application of a voltage causes the actuator box 42 to ascend while supported by the base pressor 41 against the elastic force of the elastic body 44 so as to, accordingly, cause the valve element 38 to be separated by the elastic force thereof from the valve seat 31b and the fluid channel 31a is opened, while the removal of voltage applied to the piezoelectric actuator 46 causes the piezoelectric actuator 46 to return to its original length dimension from an extended state and, the actuator box 42 is pressed down by the elastic force of the elastic body 44 to accordingly cause the valve element 38 to be pressed downward by the diaphragm presser 43 so as to come into contact with the valve seat 31b and, thereby, the fluid channel 31a is closed.

The piezoelectric actuator 46 using the piezoelectric element has the advantages of large thrust and good responsiveness and controllability, while it has the disadvantage that it has an extremely small amount of displacement of the piezoelectric element, so that it cannot have a greater stroke.

To solve the above-mentioned problems, a piezoelectric element-driven valve which is configured to transmit an amount of displacement of the piezoelectric element magnified by a displacement magnification mechanism to the valve rod having a lever structure has been developed (for example, refer to patent document 2 and patent document 6).

However, in the piezoelectric element-driven valve, a displacement magnification mechanism having a complicated structure needs to be incorporated between the piezoelectric actuator and valve rod, which creates another problems including troublesome assembly.

In contrast, in order to magnify the amount of displacement of the piezoelectric element and increase the stroke of the piezoelectric actuator, it is only necessary to stack two piezoelectric actuators vertically to configure a piezoelectric element-driven valve, but such a piezoelectric element-driven valve has not been developed so far.

Moreover, a piezoelectric element-driven valve in which the two piezoelectric actuators are simply stacked vertically is likely to have problems in wiring.

Although creating a longitudinal piezoelectric actuator achieves an increase in the stroke, in such types of piezoelectric actuators having stacked piezoelectric elements, the increase in the length of the piezoelectric elements may cause the entire piezoelectric elements to warp, which poses the problem that a highly accurate longitudinal piezoelectric actuator cannot be produced. Moreover, increasing the length of the piezoelectric element makes the same vulnerable to an external force from the horizontal direction (the direction which is perpendicular to the axis), and the piezoelectric element is disadvantageously likely to be damaged by the impact from the horizontal direction.

PRIOR ART DOCUMENT

Patent Documents

[Patent document 1] Japanese Unexamined Patent Publication No. 2003-120832
[Patent document 2] Japanese Unexamined Patent Publication No. 2004-197754
[Patent document 3] Japanese Unexamined Patent Publication No. 2005-149075
[Patent document 4] Japanese Unexamined Patent Publication No. 2007-192269
[Patent document 5] Japanese Unexamined Patent Publication No. 2008-249002
[Patent document 6] Japanese Unexamined Patent Publication No.
[Patent document 7] Japanese Unexamined Patent Publication No. 2011-117499

SUMMARY OF THE INVENTION

Problems to be Solved by the Invention

The present invention was made in view of such problems, and an object of the same is to provide a piezoelectric element-driven valve and a flow-rate control device including piezoelectric element-driven valve which allow increased amount of displacement of a piezoelectric element without using any complicated mechanism, and also which do not disturb wiring, etc.

Means for Solving the Problems

In order to achieve the above object, a first aspect of a piezoelectric element-driven valve according to the present invention is a piezoelectric element-driven valve that includes: a body provided with a fluid channel and a valve seat, a valve element which opens and closes the fluid channel by being in contact with and separated from the valve seat of the body, and a piezoelectric actuator which drives the valve element to open and close by means of the extension of the piezoelectric element, wherein at least two piezoelectric actuators are stacked and arranged on a straight line via a spacer which allows withdrawal of wiring.

A second aspect of a piezoelectric element-driven valve according to the present invention to a piezoelectric driven control valve that further includes a bottomed tubular actuator box accommodating and supporting at least two piezoelectric actuators on a straight line, and the actuator box includes a first cylinder part which accommodates one of the piezoelectric actuators, a second cylinder part which accommodates the other piezoelectric actuator, and a cylindrical connector which removably connects the first cylinder part and the second cylinder part and forms a space for accommodating a spacer between one of the piezoelectric actuators and the other piezoelectric actuator, wherein an opening portion which allows pulling out of wiring is formed on the connector.

A third aspect of a piezoelectric element-driven valve according to the present invention is such that, in the above second aspect, the valve element is formed of a resilient self-restoring metal diaphragm, and the actuator box is movably supported on the body side, a split base having an upper wall which passes through the peripheral wall at a base end portion of the actuator box and faces an upper surface of a bottom wall of the actuator box, an elastic body provided between the bottom wall of the actuator box and the upper wall of the split base, wherein the elastic body biases the actuator box to the valve element side so as to bring the valve element into contact with the valve seat, when the piezoelectric actuator extends, the actuator box is moved against the elastic force of the elastic body so as to cause the valve element to be separated from the valve seat.

A fourth aspect of a piezoelectric element-driven valve according to the present invention is such that, in the above first, second aspect or third aspect, the spacer is formed in the shape of a cylinder having an opening portion or a cutout portion which allows pulling out of wiring on its peripheral wall.

A fifth aspect of a piezoelectric element-driven valve according to the present invention is such that, in the above fourth aspect, a plurality of opening portions or cutout portions are formed on the peripheral wall of the spacer in the circumferential direction at regular intervals.

A sixth aspect of a piezoelectric element-driven valve according to the present invention is such that, in the above first, second or third aspect, the spacer is formed to have an annular fence structure or annular lattice structure which allows pulling out of wiring.

A seventh aspect of a piezoelectric element-driven valve according to the present invention is such that, in the above second or third aspect, the spacer and the actuator box are formed from a material having the same coefficient of thermal expansion.

An eighth aspect of a piezoelectric element-driven valve according to the present invention is such that, in the above seventh aspect, the spacer and the first cylinder part, second cylinder part and connector of the actuator box are made of the same Invar material.

A first aspect of a flow-rate control device according to the present invention includes the piezoelectric element-driven valve described in the above-mentioned first aspect.

A second aspect of the flow-rate control device according to the present invention includes, in the first aspect of the above flow-rate control device, an orifice which is arranged in a fluid channel on the downstream side of the valve element, a pressure sensor which is arranged in the fluid channel between the valve element and the orifice, and a control unit which controls one of the piezoelectric actuators and the other piezoelectric actuator based on a detection value of a pressure sensor.

A third aspect of the flow-rate control device according to the present invention is such that, in the first aspect of the above flow-rate control device, the piezoelectric actuator is controlled by a thermal flow rate sensor provided on the upstream side of the valve element.

Effects of the Invention

The piezoelectric element-driven valve of the present invention is so configured that at least the two piezoelectric actuators are arranged on a straight line via a spacer which allows pulling out of wiring.

The amount of displacement of the piezoelectric element can be increased compared to a known piezoelectric element-driven valve using only one piezoelectric actuator. As a result, it has a greater stroke and is able to control a large capacity of fluid.

The piezoelectric element-driven valve of the present invention has such a structure that the two piezoelectric actuators are arranged via a spacer, and therefore does not require the incorporation of a displacement magnification mechanism having a complicated structure between the piezoelectric actuator and the valve rod as in a known piezoelectric element-driven valve, and allows simple and easy assembly.

In the piezoelectric element-driven valve of the present invention, the spacer is configured to allow pulling out of wiring, and therefore wiring is enabled even when the two piezoelectric actuators are arranged.

In particular, using a spacer when having a plurality of opening portions or cutout portions formed thereon or a spacer formed to have an annular fence structure or annular lattice structure provides convenience since wiring can be pulled out in any direction of the spacer.

In the piezoelectric element-driven valve of the present invention, the spacer and the actuator box which accommodates the piezoelectric actuator are formed of the same material having a small coefficient of thermal expansion, and therefore the amounts of expansion and contraction of the spacer and the actuator box caused by heat can be matched. As a result, no gap is formed at the upper end of the upper piezoelectric actuator, and the force generated when the piezoelectric element of the piezoelectric actuator extends can be securely and successfully transmitted to the actuator box, so that highly accurate flow rate control can be performed.

The flow-rate control device of the present invention includes a piezoelectric element-driven valve configured by arranging at least the two piezoelectric actuators on a straight line via the spacer, and therefore can control a fluid at a high flow rate with high accuracy.

EMBODIMENTS FOR CARRYING OUT THE INVENTION

Embodiments of the present invention will be described in detail below with reference to drawings.

Figure 1:
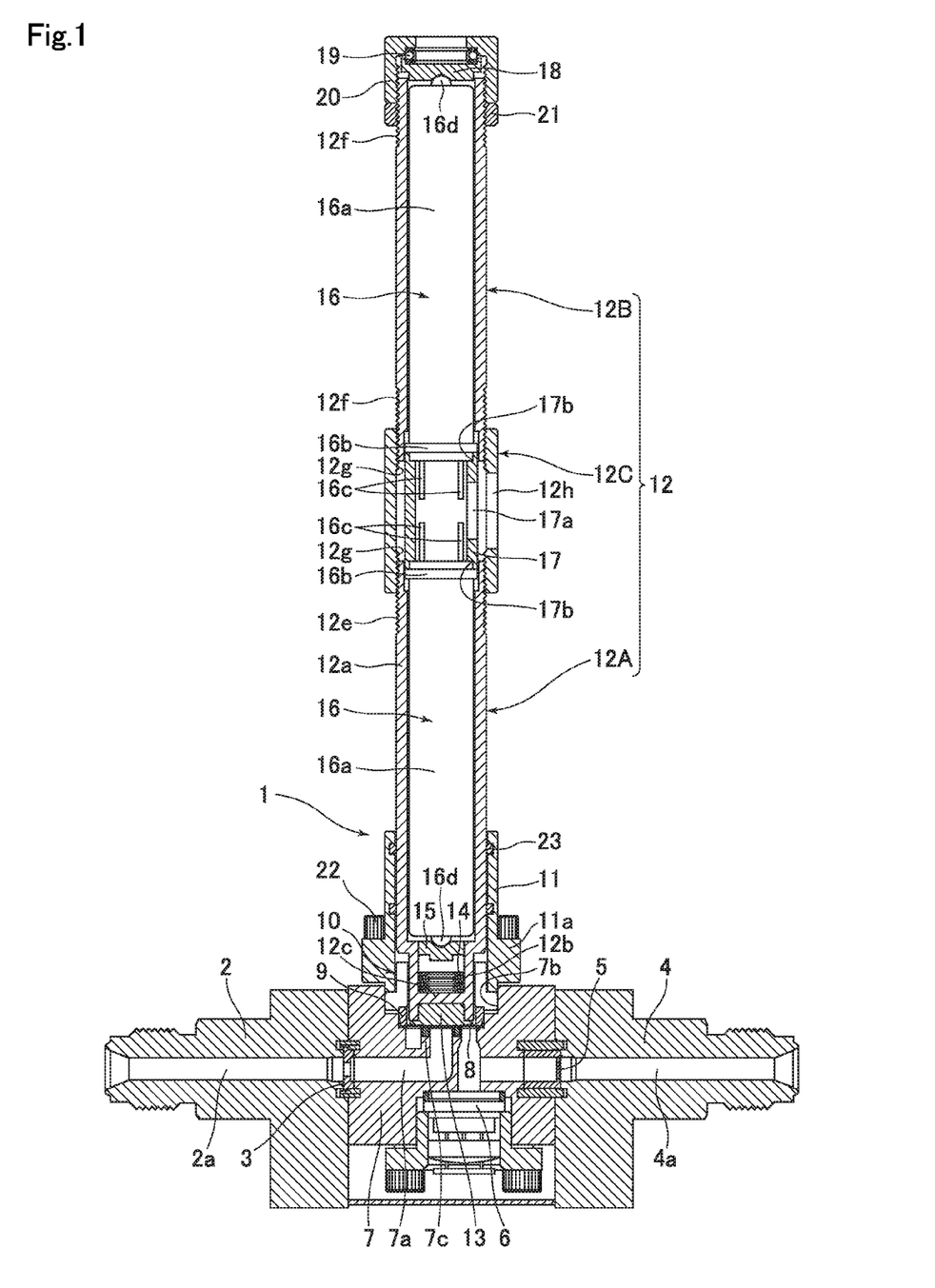
FIG. 1 is a cross-sectional view of a flow-rate control device including piezoelectric element-driven valve according to an embodiment of the present invention.

FIG. 1 shows a flow-rate control device including a piezoelectric element-driven valve 1 according to an embodiment of the present invention, in which the flow-rate control device includes the piezoelectric element-driven valve 1, an inlet side block 2 which is fastened and fixed with a bolt (not illustrated) on the upstream side of a body 7 of the piezoelectric element-driven valve 1, and has an inlet side fluid channel 2a which is in communication with a fluid channel 7a of the body 7, a sealing gasket 3 interposed between the body 7 and the inlet side block 2, fastened and fixed with a bolt (not illustrated) on the downstream side of the body 7 of the piezoelectric element-driven valve 1 and an outlet side block 4 having an outlet side fluid channel 4a which is in communication with the fluid channel 7a of the body 7, a gasket type orifice 5 for controlling the flow rate interposed between the body 7 and the outlet side block 4, a pressure sensor 6 which is arranged on the body 7 of the piezoelectric element-driven valve 1 and detects the pressure on the upstream side of the gasket type orifice 5, and a control unit (not illustrated) which controls the piezoelectric element-driven valve 1, among other components, and is a pressure type flow rate control device in which the flow rate of passage of fluid through the orifice is calculated based on the upstream side pressure of the gasket type orifice 5 and at the same time the flow rate of fluid through the orifice is controlled by opening and closing the piezoelectric element-driven valve 1.

It should be noted that the inlet side block 2, the outlet side block 4, the gasket type orifice 5, the pressure sensor 6 and the control unit (not illustrated) are configured to have similar structures to those in a conventionally known example, and therefore their detailed explanation will be omitted herein.

Moreover, the flow-rate control device including the piezoelectric element-driven valve 1 shown in FIG. 1 is used with the device itself disposed vertically.

The piezoelectric element-driven valve 1 is, as shown in FIG. 1, formed as a normal close-type piezoelectric element driven valve 1 including the body 7, the valve element 8, a presser adapter 9, a split base 10, a base pressor 11, a bottomed tubular actuator box 12, a diaphragm presser 13, an elastic body 14, a lower receiver 15, upper and lower piezoelectric actuators 16, a spacer 17, an upper receiver 18, a thrust bearing 19, an adjustment cap nut 20, a locknut 21, and other components, wherein extension of the two piezoelectric actuators 16 due to application of a voltage causes the actuator box 12 to ascend while supported by the base pressor 11 against the elastic force of the elastic body 14 so as to, accordingly, cause the valve element 8 to be separated by the elastic force thereof from the valve seat 7c and the fluid channel 7a is opened. On the other hand, the removal of voltage applied to the two piezoelectric actuators 16 causes the two piezoelectric actuators 16 to return to their original length dimensions from an extended state and, at the same time, the actuator box 12 is pressed down by the elastic force of the elastic body 14 to accordingly cause the valve element 8 to be pressed downward by the diaphragm presser 13 so as to come into contact with the valve seat 7c and, thereby, the fluid channel 7a is closed.

Specifically, the body 7 is made of stainless steel and like materials and is formed in a block shape, which includes the fluid channel 7a, an upward-opened recessed portion 7b being in communication with the fluid channel 7a and forming part of an valve chamber, and an annular valve seat 7c formed on the bottom face of the valve chamber.

The valve element 8 is composed of a resilient self-restoring metal diaphragm made of a highly durable, corrosion-resistant, and heat-resistant metal material, and is shaped in an inverted dish shape with the center thereof being slightly swelled upward. The valve element 8 is disposed inside the recessed portion 7b so as to face the valve seat 7c and the outer peripheral edge portion thereof is held and fixed in an air-tight manner toward the body 7 side using the presser adapter 9 or the like. The valve element 8 is brought into contact with the valve seat 7c through downward pressure, and is to be separated from the valve seat 7c by the elastic force thereof when the downward pressure force is lost.

It is noted that the metal diaphragm may be made of stainless steel, inconel, or other alloy steel, and may be formed by a single metal diaphragm, or a metal diaphragm composed of a plurality of diaphragms stacked together. Furthermore, the shape of the metal diaphragm may be a flat plate.

The presser adapter 9 is formed in an annular shape from a metal material such as stainless steel, and is inserted into the recessed portion 7b of the body 7 so as to press and fix the outer peripheral edge portion of the valve element 8 (metal diaphragm) in an air-tight manner toward the body 7.

Figure 2:
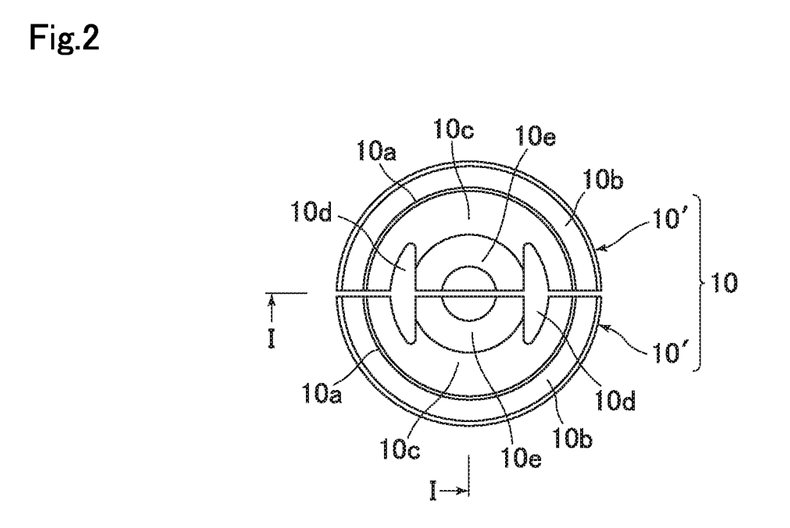
FIG. 2 is a plan view of a split base used for a piezoelectric element-driven valve.
Figure 3:
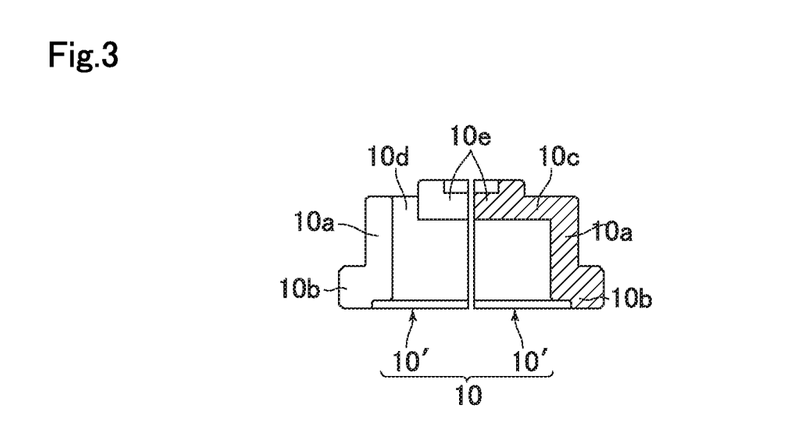
FIG. 3 is a cross-sectional view taken along line I-I in FIG. 2.

As shown in FIGS. 2 and 3, the split base 10 is composed of a pair of half-split base pieces 10' formed of a metal material such as stainless steel, and is held and fixed on the body 7 by assembling the respective split base pieces 10' on either side at the lower end portion of the actuator box 12 in such a manner so as to face each other and, in this assembled state, the respective split base pieces 10' and the lower end portion of the actuator box 12 are inserted into the recessed portion 7a of the body 7 and then the lower end portion of the base pressor 11 is inserted into the recessed portion 7b. By fastening and fixing the base pressor 11 onto the body 7 with the bolt 22, the presser adapter 9 is pressed and at the same time held and fixed onto the recessed portion 7b of the body 7.

Moreover, the two split base pieces 10' which are components of the split base 10 include a short cylindrical portion 10a, a brim 10b which is connected to the lower end of a cylinder member 10a and inserted into the recessed portion 7b of the body 7, an upper wall 10c which is connected to the upper end of the cylinder member 10a, an insertion hole 10d that is formed in the upper wall 10c and is passing through a part of the peripheral wall of the actuator box 12, and a joint 10e to be connected to the upper wall 10c and to be inserted into a guide hole 12d that is formed in the peripheral wall at the lower end portion of the actuator box 12 so as to face the upper surface of the bottom wall 12c of the actuator box 12. Furthermore, between the joint 10e of the split base 10 and the bottom wall 12c of the actuator box 12, the elastic body 14 composed of a plurality of disc springs which are provided so as to press and bias the actuator box 12 downward and which bring the center of the valve element 8 into contact with the valve seat 7c via the diaphragm presser 13 is interposed.

The base pressor 11 is formed in the shape of a cylinder from a metal material such as stainless steel. On the outer peripheral surface at lower end portion of the base pressor 11, a flange portion 11a is formed to oppose the inner peripheral edge portion of the recessed portion 7b of the body 7, and multiple O-rings 23 are fitted on the inner peripheral surface at regular intervals.

This base pressor 11 is fixed onto the body 7 side in a standing manner with the bolt 22, and supports the actuator box 12 toward the body 7 side ascendably and descendably, and the base pressor 11 presses and fixes the outer peripheral edge portion of the valve element 8, the presser adapter 9, and the brim 10b of the split base 10, toward the body 7 side.

As shown in FIG. 1, the actuator box 12 is made of a material having a small coefficient of thermal expansion (preferably, $2 \times 10^{-6}$/K or lower) in the shape of a bottomed cylinder. While accommodating and supporting the two piezoelectric actuators 16, elastic body 14, lower receiver 15 and spacer 17 on a straight line, the actuator box 12 has a lower end portion inserted into and supported by the base pressor 11 via an O-ring 23.

That is, the actuator box 12 includes the lower (one of the two) piezoelectric actuator 16, a bottomed cylindrical first cylinder part 12A accommodating the elastic body 14 and the lower receiver 15, a second cylinder part 12B accommodating upper (the other of the two) piezoelectric actuator 16, and a cylindrical connector 12C which removably connects the first cylinder part 12A and second cylinder part 12B and forms an accommodating space such as the spacer 17 between the lower (one of the two) piezoelectric actuator 16 and upper (the other) piezoelectric actuator 16, so as to press the center of the valve element 8 downwardly.

Figure 4:
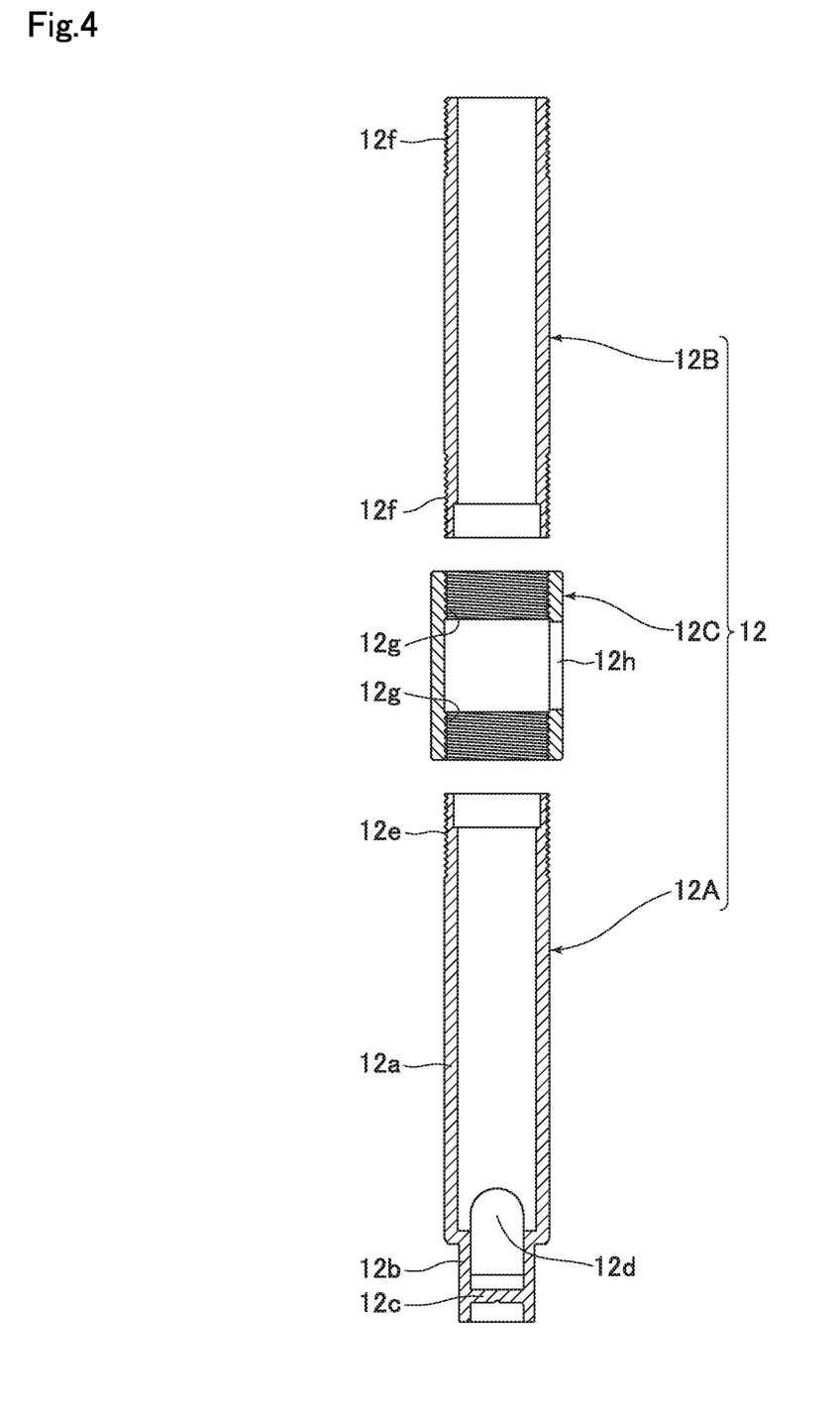
FIG. 4 is an exploded cross-sectional view of an actuator box used for a piezoelectric element-driven valve.

The first cylinder part 12A, as shown in FIG. 4, is formed in the shape of a bottomed cylinder from an Invar material such as Invar, Super Invar, stainless steel Invar or the like, and includes a cylindrical large diameter portion 12a which accommodates the lower piezoelectric actuator 16 and having a lower end portion inserted into the base pressor 11 vertically and slidably via the O-ring 23, and a cylindrical small diameter portion 12b which is integrally provided at the lower end of the large diameter portion 12a and which accommodates the elastic body 14 and the lower receiver 15.

Moreover, a bottom wall 12c is integrally provided on the inside of the small diameter portion 12b, the elastic body 14 and the lower receiver 15 are accommodated in a space above the bottom wall 12c, the diaphragm presser 13 is inserted and fixed into a space below the bottom wall 12c.

Furthermore, on the peripheral wall at the boundary of the large diameter portion 12a and the small diameter portion 12b, longitudinal guide holes 12d into which the joint 10e of the split base 10 is inserted are formed in an opposing manner.

Furthermore, on the outer circumferential surface of the large diameter portion 12a at the upper end portion, a male screw 12e onto which a connector 12C is removably screwed is formed.

As shown in FIG. 4, the second cylinder part 12B is formed in the shape of a cylinder from an Invar material such as Invar, Super Invar, and stainless steel Invar, and accommodates the upper piezoelectric actuator 16 in itself.

On the outer peripheral surface at the lower end portion of this second cylinder part 12B, a male screw 12f onto which the connector 12C is removably screwed is formed, while on the outer circumferential surface of the second cylinder part 12B at the upper end portion, the male screw 12f onto which the adjustment cap nut 20 and the locknut 21 are screwed is formed so as to allow vertical movement and adjustment.

As shown in FIG. 4, the connector 12C is formed in the shape of a cylinder from an Invar material such as Invar, Super Invar, and stainless steel, connects the first cylinder part 12A and the second cylinder part 12B and accommodates the spacer 17 and a lead terminal 16c, a connector (not illustrated) and other components.

On the inner circumferential surfaces at both ends of this connector 12C, female screws 12g which are removably screwed onto the male screw 12e of the first cylinder part 12A and the male screw 12f of the second cylinder part 12B, respectively, are formed, and on the peripheral wall, an opening portion 12h for pulling wiring out is formed.

It should be noted that in FIGS. 1 and 4, the number of the opening portion 12h of the connector 12C is one, but a plurality of the opening portions 12h may be formed on the peripheral wall of the connector 12C along the circumferential direction at regular intervals. In this case, wiring can be drawn in any direction of the connector 12C.

The upper and lower piezoelectric actuators 16, as shown in FIG. 1, is configured to be the laminate type piezoelectric actuator 16 in which each piezoelectric actuators 16 accommodates a stack type piezoelectric element (not illustrated) in a casing 16a made of metal with one end closed, and seals the other end portion of the casing 16a in an airtight manner with a stepped base 16b, wherein the lead terminal 16c is protruding from the base 16b, extension and contraction of the piezoelectric element reciprocally move a semi-spherical displacement portion 16d provided at the tip of the casing 16a along the axis of the piezoelectric actuator 16.

The lower piezoelectric actuator 16, as shown in FIG. 1, is accommodated in the first cylinder part 12A of the actuator box 12 in a state that the semi-spherical displacement portion 16d faces down, its lower end portion (displacement portion 16d) is supported by the joint 10e of the split base 10 via the lower receiver 15, and the lead terminal 16c is positioned within the spacer 17.

It should be noted that the lower receiver 15 is formed in the shape of a disc from a metal material such as stainless steel, and at the center of its top surface, a conical receiving groove into which the semi-spherical displacement portion 16d of the lower piezoelectric actuator 16 is fitted in a state of being positioned is formed.

In contrast, the upper piezoelectric actuator 16, as shown in FIG. 1, is accommodated in the second cylinder part 12B of the actuator box 12 in a state that the semi-spherical displacement portion 16d faces up. Its lower end portion (stepped base 16b) is stacked on the lower piezoelectric actuator 16 via the spacer 17, and its upper end portion (displacement portion 16d) is positionably supported by the adjustment cap nut 20 screwed onto the upper end portion of the second cylinder part 12B so as to allow vertical movement and adjustment via the upper receiver 18 and the thrust bearing 19.

Moreover, the lead terminal 16c of the upper piezoelectric actuator 16 is positioned within the spacer 17 as the lead terminal 16c of the lower piezoelectric actuator 16.

It should be noted that the upper receiver 18 is formed in the shape of a disc from a metal material such as stainless steel, and at the center of its lower center, a conical receiving groove which is fitted in a state that the semi-spherical displacement portion 16d of the upper piezoelectric actuator 16 has been position is formed.

Thus, the upper and lower piezoelectric actuators 16 are configured to extend upward by application of a voltage to press the actuator box 12 upward against the elastic force of the elastic body 14.

To match the amounts of expansion and contraction of the spacer 17 and the actuator box 12 caused by heat, the spacer 17 is formed of a material (preferably, $2\times10^{-6}$/K or lower) having a small coefficient of thermal expansion as the actuator box 12.

Figure 5:
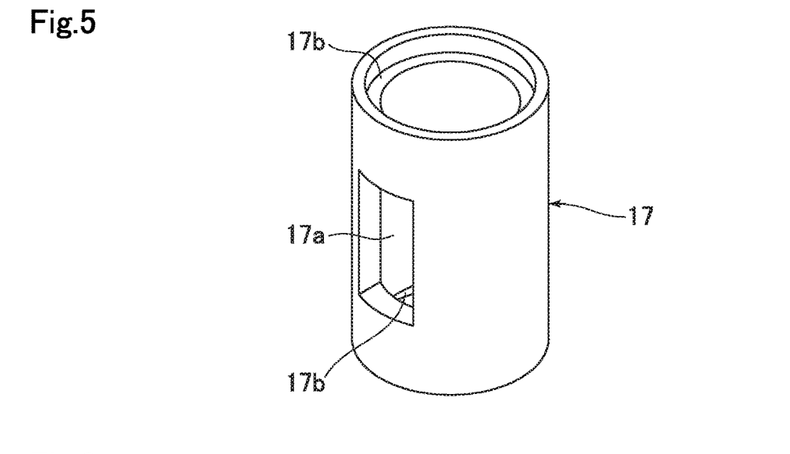
FIG. 5 is a perspective view of a spacer used for a piezoelectric element-driven valve.

That is, the spacer 17, as shown in FIG. 5, is formed in the shape of a cylinder from an Invar material such as Invar, Super Invar, and stainless steel Invar, and on its peripheral wall, a single square-shaped opening portion 17a through which wiring can be pulled out is formed.

Moreover, on the upper end face and lower end face of the spacer 17, stepped portions 17b are formed to closely fit with the stepped base 16b of the upper piezoelectric actuator 16 and the stepped base 16b of the lower piezoelectric actuator 16, and when the upper end portion and lower end portion of the spacer 17 are fitted with the upper and lower stepped bases 16b of the piezoelectric actuators 16, the spacer 17 and upper and lower piezoelectric actuators 16 are positioned and disposed on a straight line so that their axes coincide.

Figure 6:
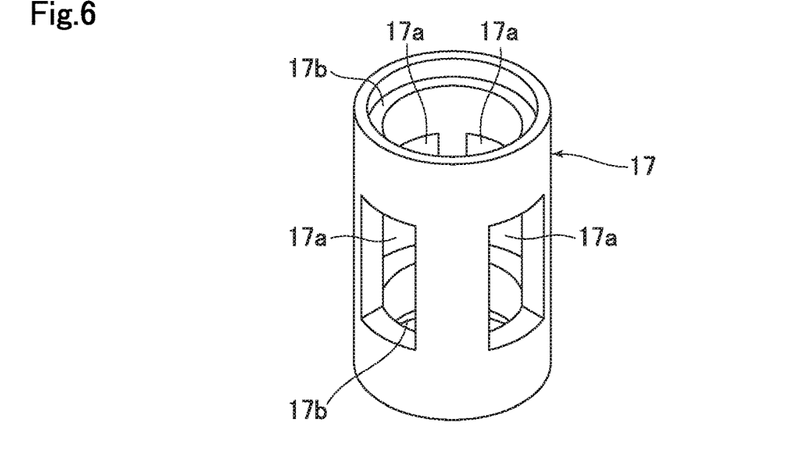
FIG. 6 is a perspective view showing another example of the spacer.

FIG. 6 shows another example of the spacer 17, wherein in this spacer 17, a plurality of opening portions 17a (in this example, four) are formed at regular intervals on the peripheral wall along the circumferential direction, and other structures are the same as in the spacer 17 shown in FIG. 5.

Since this spacer 17 includes a plurality of the opening portions 17a, the opening portion 17a of the spacer 17 and the opening portion 12h of the connector 12C are allowed to match, and wiring can be drawn out in any direction of the spacer 17.

It should be noted that in the above-mentioned embodiment, the opening portions 17a are formed on the peripheral wall of the spacer 17, while in another embodiment, although not illustrated, a single or a plurality of cutout portions for pulling out wiring may be formed on the peripheral wall at the upper end portion or the lower end portion of the spacer 17.

Figure 7:
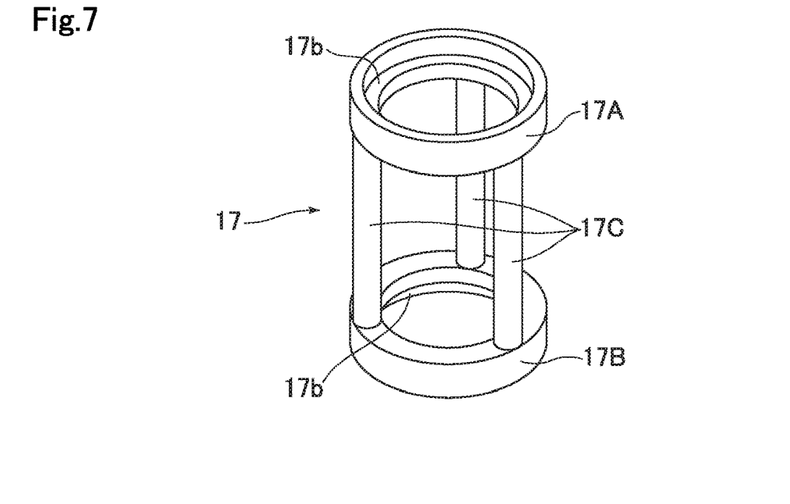
FIG. 7 is a perspective view showing still another example of the spacer.

FIG. 7 shows still another example of the spacer 17, and the spacer 17 is configured to have an annular fence structure from an Invar material such as Invar, Super Invar, and stainless steel Invar, and wiring can be drawn out in any direction of the spacer 17.

This spacer 17 includes an annular upper member 17A, an annular lower member 17B disposed to oppose the upper member 17A, a plurality of bar-shaped connecting members 17C which connect the upper member 17A and lower member 17B.

On the top surface of the upper member 17A and the lower surface of lower member 17B, stepped portions 17b are formed to closely fit with the stepped base 16b of the upper piezoelectric actuator 16 and the stepped base 16b and the lower piezoelectric actuator 16, so that it is configured that the spacer 17 and the upper and lower piezoelectric actuators 16 are positioned and disposed on a straight line when the upper end portion and lower end portion of the spacer 17 are fitted with the upper and lower stepped bases 16b of the piezoelectric actuator 16.

Figure 8:
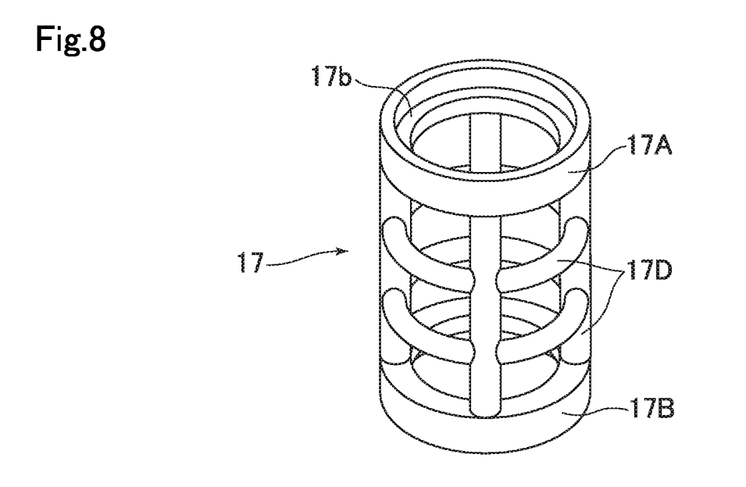
FIG. 8 is a perspective view showing still another example of the spacer.

FIG. 8 shows still another example of the spacer 17, in which the spacer 17 is configured to have an annular lattice structure from an Invar material such as Invar, Super Invar, stainless steel Invar, and wiring can be drawn out in any direction of the spacer 17.

This spacer 17 includes an annular upper member 17A, an annular lower member 17B disposed to oppose the upper member 17A, a lattice-shaped connecting member 17D which connects the upper member 17A and lower member 17B.

Moreover, on the top surface of the upper member 17A of the spacer 17 and on the lower surface of the lower member 17B, stepped portions 17b are formed to closely fit with the stepped base 16b of the upper piezoelectric actuator 16 and the stepped base 16b of the lower piezoelectric actuator 16, and the spacer 17 and the upper and lower piezoelectric actuators 16 are positioned and disposed on a straight line when the upper end portion and lower end portion of the spacer 17 are fitted with the upper and lower stepped bases 16b of the piezoelectric actuator 16.

Thus, according to the piezoelectric element-driven valve 1, when a drive voltage is applied to the upper and lower piezoelectric actuators 16 from the control unit (not illustrated), the upper and lower piezoelectric actuators 16 extend upwardly in response to the application of the voltage by a setting value.

This exerts a great upward pressing force on the actuator box 12 via the spacer 17, the upper receiver 18, the thrust bearing 19 and the adjustment cap nut 20, and the actuator box 12 ascends against the elastic force of the elastic body 14 in state that it is retained by the base pressor 11 at its axis by the length of the above setting value. As a result, the elastic body 14 is brought away from the valve seat 7c by its elastic force, and the piezoelectric element-driven valve 1 comes into an open state.

It should be noted that the aperture of the piezoelectric element-driven valve 1 is adjusted by varying a voltage applied to the piezoelectric drive element 14.

In contrast, the removal of a voltage applied to the upper and lower piezoelectric actuators 16 causes the upper and lower piezoelectric actuators 16 to return to their original length dimension from an extended state and, at the same time, the actuator box 12 is pressed down by the elastic force of the elastic body 14 to accordingly cause the center of the valve element 8 to be pressed downward to the valve seat 7c side by the diaphragm presser 13 provided at the lower end of the actuator box 12 so as to come into contact with the valve seat 7c and, thereby, the piezoelectric element-driven valve 1 comes into a closed state.

Since the piezoelectric element-driven valve 1 is configured to stack the two piezoelectric actuators 16 via a spacer 17 which allows wiring to be drawn out on a vertical straight line, it can greatly increase the amount of displacement of the piezoelectric element. As a result, it has a greater stroke and is able to control a large capacity of fluid.

Moreover, the piezoelectric element-driven valve 1 can be configured only by stacking the two piezoelectric actuators 16 via the spacer 17, and therefore allows simple and easy assembly.

Furthermore, in the piezoelectric element-driven valve 1, the spacer 17 has such a configuration that allows pulling out of wiring, and therefore wiring is possible even if the two piezoelectric actuators 16 are stacked.

In addition, the flow-rate control device including the piezoelectric element-driven valve 1 has the piezoelectric actuators 16 stacked vertically, and therefore can control a fluid of a high flow rate with high accuracy.

It should be noted that in the above-mentioned embodiment, the piezoelectric element-driven valve 1 is used for a pressure control type flow-rate control device, but in another embodiment, the piezoelectric element-driven valve 1 may be used for a thermal flow-rate control device by a thermal flow rate sensor.

Moreover, in the above-mentioned embodiment, the piezoelectric element-driven valve 1 is formed as a normal close-type control valve, but in another embodiment, the piezoelectric element-driven valve 1 may be a normal open-type control valve.

Furthermore, in the above-mentioned embodiment, a metal diaphragm is used for the valve element 8 of the piezoelectric element-driven valve 1, but in another embodiment, the valve element 8 other than a metal diaphragm may be used.

Furthermore, in the above-mentioned embodiment, the two piezoelectric actuators 16 are stacked on a vertical straight line via the spacer 17, but in another embodiment, three or more of the piezoelectric actuators 16, may be stacked on a vertical straight line via the spacers 17 which allow pulling out of wiring. In this case, it is needless to say that the drive force should be transmitted to each of the other piezoelectric actuators 16 via the respective spacers 17. Moreover, the actuator box 12 is divided into three or more pieces in portions opposing each of the spacers 17, it is needless to say that these divided three or more components should be removably connected via the connector 12C.

Furthermore, in the above-mentioned embodiment, the flow-rate control device including the piezoelectric element-driven valve 1 is used in a vertical disposition, but in another embodiment, the flow-rate control device including the piezoelectric element-driven valve 1 may be used in a horizontal (horizontal position) disposition. In this case, the two piezoelectric actuators 16 are arranged on a straight line in a back-and-forth or right-and-left relationship via the spacer 17.

DESCRIPTION OF REFERENCE SIGNS 1 denotes a piezoelectric element-driven valve, 2 denotes an inlet side block, 2a denotes an inlet side fluid channel, 3 denotes a gasket, 4 denotes an outlet side block, 4a denotes an outlet side fluid channel, 5 denotes a gasket type orifice, 6 denotes a pressure sensor, 7 denotes a body, 7a denotes a fluid channel, 7b denotes a recessed portion, 7c denotes a valve seat, 8 denotes a valve element (metal diaphragm), 9 denotes a presser adapter, 10 denotes a split base, 10' denotes a split base piece, 10a denotes a short cylinder member, 10b denotes a brim, 10c denotes an upper wall, 10d denotes an insertion hole, 10e denotes a joint, 11 denotes a base presser, 11a denotes a flange portion, 12 denotes an actuator box, 12A denotes a first cylinder part, 12B denotes a second cylinder part, 12C denotes a connector, 12a denotes a large diameter portion, 12b denotes a small diameter portion, 12c denotes a bottom wall, 12d denotes a guide hole, 12e denotes a lower part cylinder part of a male screw, 12f denotes an upper part cylinder part of the male screw, 12 g denotes a female screw, 12h denotes an opening portion, 13 denotes a diaphragm presser, 14 denotes an elastic body, 15 denotes a lower receiver, 16 denotes a piezoelectric actuator, 16a denotes a casing, 16b denotes a base, 16c denotes a lead terminal, 16d denotes a displacement portion, 17 denotes a spacer, 17a denotes an opening portion, 17b denotes a stepped portion, 17A denotes an annular upper member, 17B denotes an annular lower member, 17C denotes a bar-shaped connecting member, 17D denotes a lattice-shaped connecting member, 18 denotes an upper receiver, 19 denotes a thrust bearing, 20 denotes an adjustment cap nut, 21 denotes a locknut, 22 denotes a bolt, 23 denotes a O-ring, 24 denotes a control unit.

The invention claimed is:

1. A piezoelectric element-driven valve comprising:
   a body provided with a fluid channel and a valve seat;
   a valve element which opens and closes the fluid channel by being in contact with and separated from the valve seat of the body;
   at least two piezoelectric actuators having lead terminals provided on each opposing end face, being arranged on a straight line, driving the valve element to open and close by means of the extension of the piezoelectric element, and
   a tubular spacer provided between the at least two piezoelectric actuators, and in connection with the each opposing end face to separate the at least two piezoelectric actuators, accommodating the lead terminals, and capable of pulling out of wiring from the lead terminals.

2. The piezoelectric element-driven valve according to claim 1, wherein the piezoelectric element-driven valve further comprises a bottomed tubular actuator box which accommodates and supports at least the two piezoelectric actuators on a straight line, the bottomed tubular actuator box comprising a first cylinder part which accommodates one of the piezoelectric actuators, a second cylinder part which accommodates the other piezoelectric actuator, and a cylindrical connector which removably connects the first cylinder part and the second cylinder part and forms a space for accommodating the spacer between one of the piezoelectric actuators and the other piezoelectric actuator, and wherein an opening portion which allows pulling out of wiring is formed on the cylindrical connector.

3. A piezoelectric element-driven valve comprising a body provided with a fluid channel and a valve seat, a valve element which opens and closes the fluid channel by being in contact with and separated from the valve seat of the body, and at least two piezoelectric actuators which drive the valve element to open and close by means of the extension of the piezoelectric element, in which at least the two piezoelectric actuators are arranged on a straight line via a spacer which allows pulling out of wiring; wherein the piezoelectric element-driven valve further comprises a bottomed tubular actuator box which accommodates and supports at least the two piezoelectric actuators on a straight line, the bottomed tubular actuator box comprising a first cylinder part which accommodates one of the piezoelectric actuators, a second cylinder pan which accommodates the other piezoelectric actuator, and a cylindrical connector which removably connects the first cylinder part and the second cylinder part and forms a space for accommodating the spacer between one of the piezoelectric actuators and the other piezoelectric actuator, and wherein an opening portion which allows pulling out of wiring is formed on the cylindrical connector; and wherein the valve element is formed of a resilient self-restoring metal diaphragm, the actuator box being supported movably toward the body, wherein the piezoelectric element-driven valve comprises a split base passing through a peripheral wall at a base end portion of the actuator box and having an upper wall opposing an upper surface of a bottom wall of the actuator box, and an elastic body which is interposed between the bottom wall of the actuator box and the upper wall of the split base and which presses and biases the actuator box to the valve seat side so as to cause the valve element to be into contact with the valve seat, and wherein when the piezoelectric actuator extends, the actuator box is moved against the elastic force of the elastic body so as to cause the valve element to be separated from the valve seat.

4. The piezoelectric element-driven valve according to claim 1, wherein the spacer is formed in the shape of a cylinder having an opening portion or a cutout portion which allows pulling out of wiring on its peripheral wall.

5. The piezoelectric element-driven valve according to claim 4, wherein a plurality of opening portions or cutout portions are formed on the peripheral wall of the spacer in the circumferential direction at regular intervals.

6. The piezoelectric element-driven valve according to claim 1, wherein the spacer is formed to have an annular fence structure or annular lattice structure which allows pulling out of wiring.

7. The piezoelectric element-driven valve according to claim 2, wherein the spacer and the actuator box are formed from a material having the same coefficient of thermal expansion.

8. The piezoelectric element-driven valve according to claim 7, wherein the spacer, the first cylinder part, the second cylinder part and the connector of the actuator box are formed from the same Invar material.

9. A flow-rate control device having a piezoelectric element-driven valve, wherein the piezoelectric element-driven valve comprising:

a body provided with a fluid channel and a valve seat;
a valve element which opens and closes the fluid channel by being in contact with and separated from the valve seat of the body;
at least two piezoelectric actuators having lead terminals provided on each opposing end face of the at least two piezoelectric actuations, being arranged on a straight line, driving the valve element to open and close by means of the extension of the piezoelectric element; and
a tubular spacer provided between the at least two piezoelectric actuators, and in connection with the each opposing end face to separate the at least two piezoelectric actuators, accommodating the lead terminals, and capable of pulling out of wiring from the lead terminals.

10. The flow-rate control device according to claim 9, further comprising an orifice arranged in a fluid channel on the downstream side of the valve element, a pressure sensor arranged in the fluid channel between the valve element and the orifice, and a control unit which controls one of the piezoelectric actuators and the other piezoelectric actuator based on a detection value of the pressure sensor.

11. The flow-rate control device according to claim 9, wherein the piezoelectric actuators are controlled by a thermal flow rate sensor provided on the upstream side of the valve element.

12. The piezoelectric element-driven valve according to claim 2, wherein the spacer is formed in the shape of a cylinder having an opening portion or a cutout portion which allows pulling out of wiring on its peripheral wall.

13. The piezoelectric element-driven valve according to claim 3, wherein the spacer is formed in the shape of a cylinder having an opening portion or a cutout portion which allows pulling out of wiring on its peripheral wall.

14. The piezoelectric element-driven valve according to claim 2, wherein the spacer is formed to have an annular fence structure or annular lattice structure which allows pulling out of wiring.

15. The piezoelectric element-driven valve according to claim 3, wherein the spacer is formed to have an annular fence structure or annular lattice structure which allows pulling out of wiring.

16. The piezoelectric element-driven valve according to claim 3, wherein the spacer and the actuator box are formed from a material having the same coefficient of thermal expansion.

17. The piezoelectric element-driven valve according to claim 1, provided with stepped bases on the each opposing end face, wherein stepped portions formed on the upper end face and lower end face of the spacer are closely fitted with each of the stepped bases, when each of the stepped bases are fitted with each of the stepped portions, the spacer and the at least two piezoelectric actuators are positioned and disposed on a straight line so that their axes coincide.

* * * * *